US008669783B2

(12) United States Patent
Canu et al.

(10) Patent No.: US 8,669,783 B2
(45) Date of Patent: Mar. 11, 2014

(54) INTERFACE DEVICE WITH PROGRAMMABLE VOLTAGE GAIN AND/OR INPUT IMPEDANCE HAVING AN ANALOG SWITCH COMPRISING N AND P FIELD EFFECT TRANSISTORS CONNECTED IN SERIES

(75) Inventors: Antoine Philippe Marie Canu, Meudon la Foret (FR); Philippe Benabes, Gif-sur-Yvette-Cedex (FR); David Jose Faura, Meudon la Foret (FR); Marc Jacques Yvon Gatti, Pessac Cedex (FR)

(73) Assignee: Thales, Neuilly sur Seine (FR)

( * ) Notice: Subject to any disclaimer, the term of this patent is extended or adjusted under 35 U.S.C. 154(b) by 189 days.

(21) Appl. No.: 13/463,187

(22) Filed: May 3, 2012

(65) Prior Publication Data

US 2012/0280327 A1 Nov. 8, 2012

(30) Foreign Application Priority Data

May 3, 2011 (FR) ...................................... 11 01362

(51) Int. Cl.
*H03K 19/094* (2006.01)
(52) U.S. Cl.
USPC ................................................ 326/86; 326/27
(58) Field of Classification Search
USPC .................. 326/21, 26–27, 63, 68, 80–83, 86
See application file for complete search history.

(56) References Cited

U.S. PATENT DOCUMENTS

| 5,424,656 | A | * | 6/1995 | Gibson et al. | 326/63 |
| 5,912,569 | A | * | 6/1999 | Alleven | 327/108 |
| 6,737,887 | B2 | * | 5/2004 | Forbes et al. | 326/86 |
| 8,378,714 | B2 | * | 2/2013 | Liang et al. | 326/83 |
| 2002/0032893 | A1 | * | 3/2002 | Brooks et al. | 716/1 |
| 2006/0132177 | A1 | * | 6/2006 | Brooks et al. | 326/68 |
| 2008/0007443 | A1 | * | 1/2008 | Inose | 341/158 |
| 2008/0224972 | A1 | * | 9/2008 | Nakajima et al. | 345/87 |

* cited by examiner

*Primary Examiner* — Jason M Crawford
(74) *Attorney, Agent, or Firm* — Young & Thompson

(57) ABSTRACT

An interface device for connection between two electronic components of an electronic circuit, includes:
 an input terminal, an output terminal and a reference terminal, an input voltage between the reference and input terminals, an output voltage between the reference and output terminals, an input impedance, and an output voltage gain,
 at least one resistance connected to at least one terminal among the input and output terminals,
 at least one analog switch positioned between the output and reference terminals, the switch having a closed or an open state, and
 control elements for each switch, at least one parameter among the input impedance and the output voltage gain of the device having distinct values as a function of whether the analog switch is closed or open,
 each analog switch including at least one N-type field effect controllable transistor and one P-type field effect controllable transistor connected in series.

14 Claims, 5 Drawing Sheets

Figure 1:
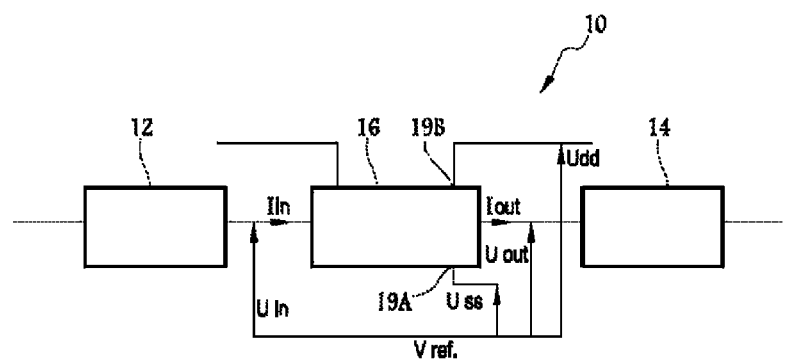

INTERFACE DEVICE WITH PROGRAMMABLE VOLTAGE GAIN AND/OR INPUT IMPEDANCE HAVING AN ANALOG SWITCH COMPRISING N AND P FIELD EFFECT TRANSISTORS CONNECTED IN SERIES

The present invention relates to an interface device, which can be connected between two electronic components of an electronic circuit and comprising:

an input terminal, an output terminal and a reference terminal, the device having an input voltage between the reference terminal and the input terminal, an output voltage between the reference terminal and the output terminal, an input impedance, and an output voltage gain, at least one resistance connected to at least one terminal among the input terminal and the output terminal, at least one analog switch positioned between the output terminal and the reference terminal, the switch having a closed state or an open state, and control means for the or each switch, at least one parameter among the input impedance and the output voltage gain of the device having distinct values as a function of whether the analog switch is closed or open.

The invention also relates to an electronic system having an electronic component capable of delivering an output voltage, an analog-digital converter, and such an interface device connected between the electronic component and the analog-digital converter.

An interface device of the aforementioned type is known from the technical sheet for the PGA2310 electronic component by Texas Instruments. The electronic component includes an interface device with programmable voltage gain comprising an input terminal, an output terminal, and a reference terminal, a plurality of resistances connected between the input and output terminals, a multiplexer including a plurality of analog switches connected in parallel to the resistances, and means for controlling each switch.

Furthermore, known from document WO 97/24807 is a type of switch commonly used as analog switch, for example in multiplexers. This type of switch comprises two connection terminals, an N-type field effect controllable transistor and a P-type field effect controllable transistor connected in parallel to the N-type transistor.

However, such interface devices have a voltage operating range limited at the outside to their supply voltages and cannot be used with higher voltages. This drawback on the one hand prevents these interface devices from being connected with electronic components such as transducers, or buses, capable of producing high voltages, in the vicinity of several tens of volts, or several hundreds of volts, and on the other hand prohibits said interface devices from being used in an environment capable of causing high voltages at the terminals of the electronic components.

The aim of the invention is to propose a programmable interface device having an extended voltage operating range, so as to connect it with electronic components capable of producing high voltages.

To that end, the invention relates to an interface device of the aforementioned type, characterized in that the or each analog switch comprises at least one N-type field effect controllable transistor and one P-type field effect controllable transistor connected in series.

According to other embodiments, the interface device includes one or more of the following features, considered alone or according to all technically possible combinations:

the device comprises two resistances, the first resistance being connected between the input terminal and the output terminal, and the second resistance being connected to the analog switch on the one hand and the output terminal on the other hand, the or each analog switch comprises at least three N- or P-type controllable field effect transistors, alternatingly connected in series, the field effect transistors of the or each analog switch are MOSFET transistors of the N (NMOS) or P (PMOS) type, the device comprises a polarization stage connected to the output terminal of the device and capable of being connected to a polarization potential, and the polarization stage comprises a polarization resistance, a field effect controllable transistor, and a protection diode of the transistor, the device comprises a plurality of resistances connected in series between the input terminal and the output terminal, and the resistances are connected to one another at respective connection nodes, the device comprises at least one polarization stage connected, on the one hand, to a point among the output terminal and the connection node and capable of being connected, on the other hand, to a polarization potential, and the or each polarization stage comprises a polarization resistance, a controllable field effect transistor, and a protection diode of the transistor, the transistor of the or each polarization stage is a MOSFET transistor of the P (PMOS) or N (NMOS) types, the substrates of each field effect transistor of the or each analog switch are connected to protection diodes, the substrates of each field effect transistor of the or each analog switch are not electrically connected to any potential, the device includes means for establishing a high inversion regime of the field effect transistors of the or each analog switch, when said switch(es) are in their closed state, and the control means for the or each analog switch are capable of applying control voltages on the gate of each field effect transistor of the or each analog switch, the voltage applied on the gate of each N-type field effect transistor of a given switch having a value opposite that of the voltage applied on the gate of each P-type field effect transistor of that given switch.

The invention also relates to an electronic system, of the type having an electronic component, an analog-digital converter, and an interface device connected between the electronic component and the analog-digital converter, characterized in that the interface device is as defined above.

According to another embodiment, the electronic system includes the following features:

the maximum value of the voltage delivered by the electronic component is greater than the supply voltages of the interface device, or the control voltages of the or each analog switch of the interface device.

Figure 2:
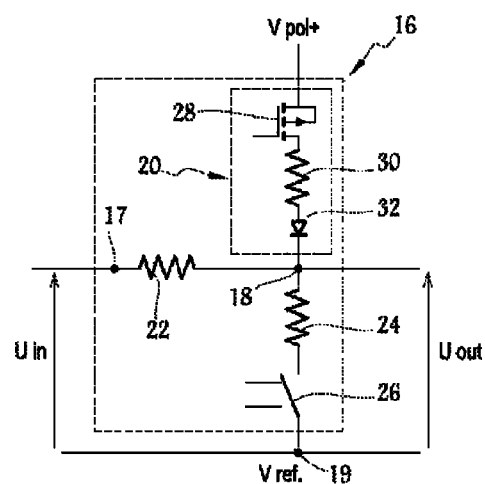
Figure 3:
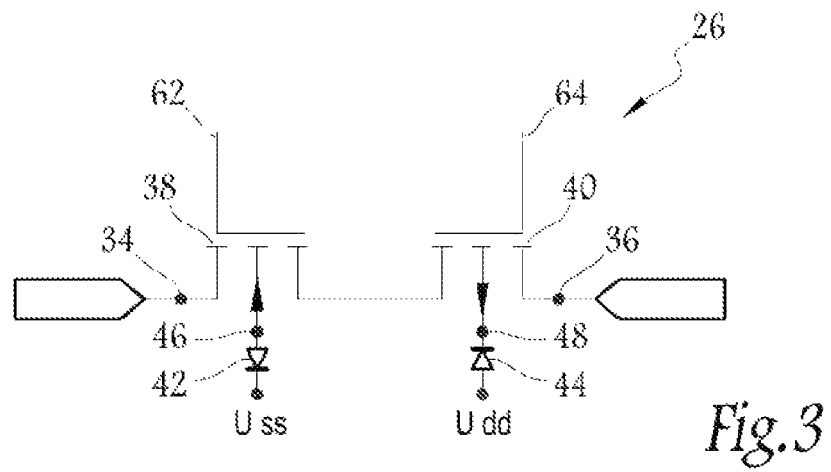
Figure 4:
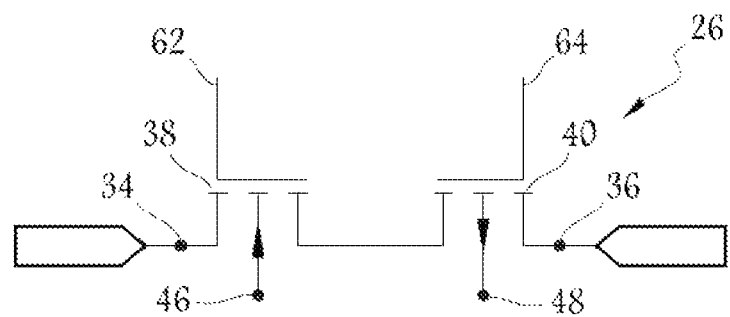
Figure 5:
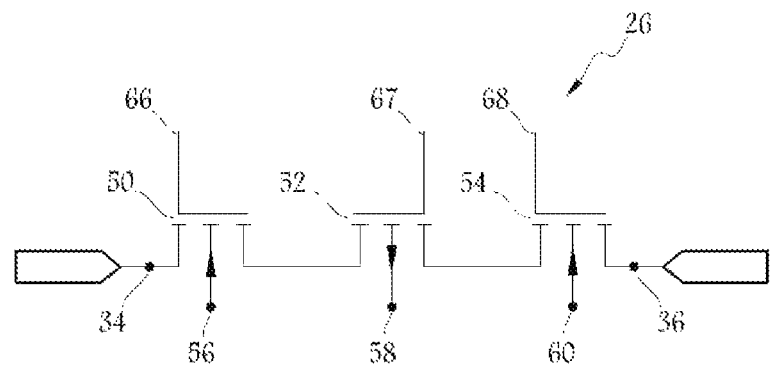
Figure 6:
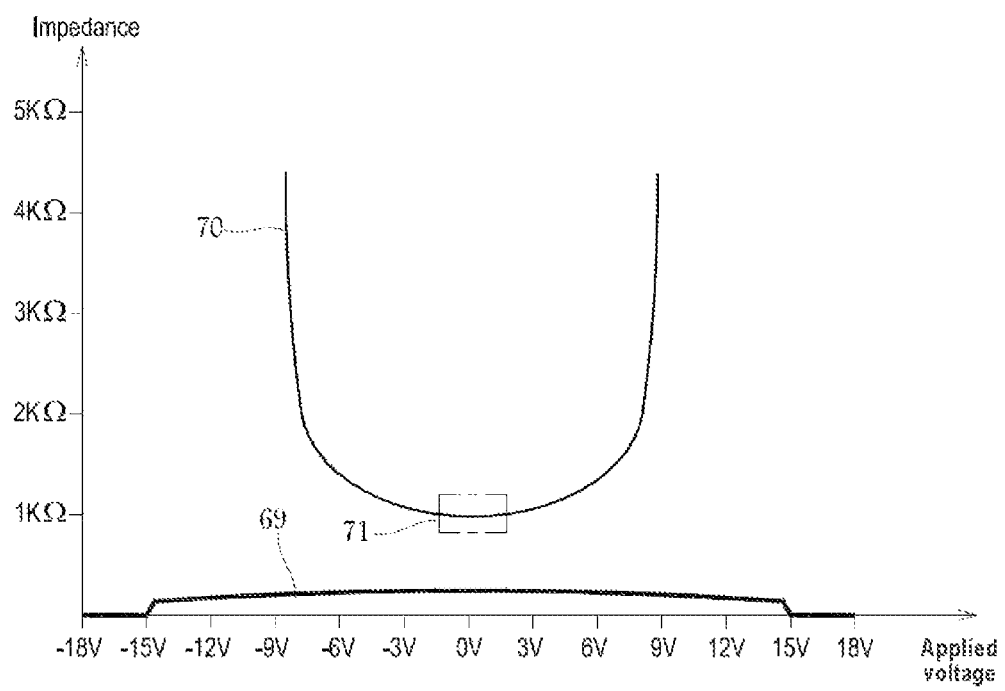
Figure 7:
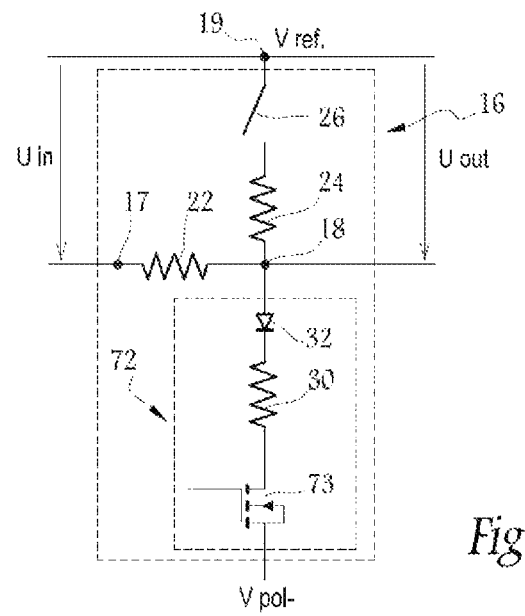
Figure 8:
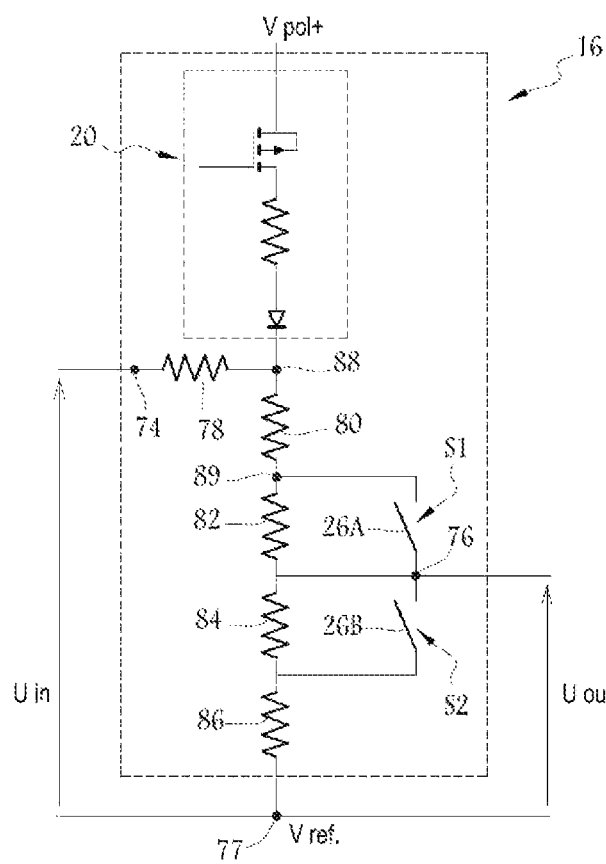
Figure 9:
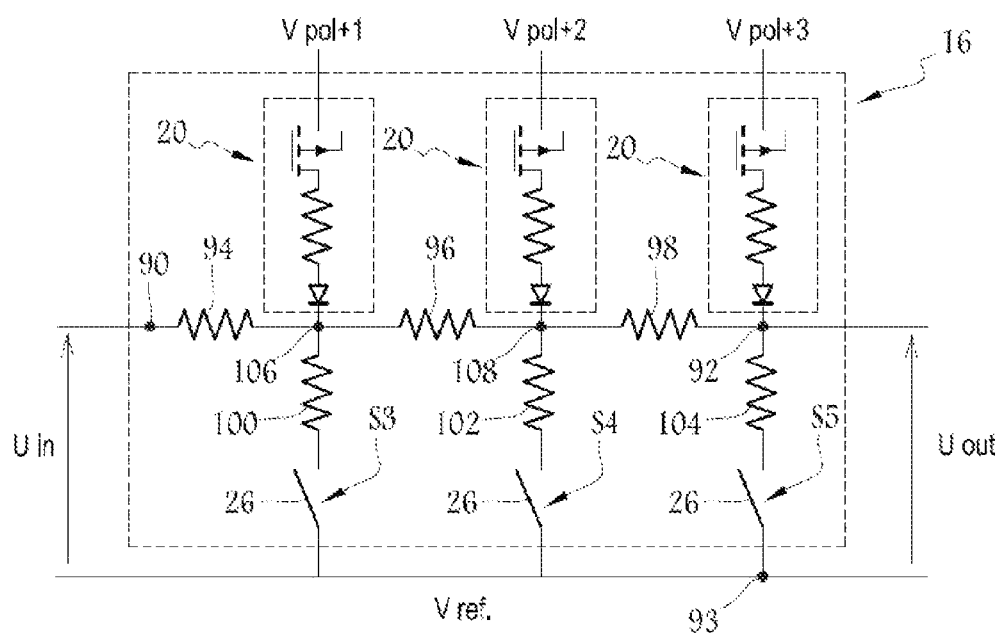

These features and advantages of the invention will appear upon reading the following description, provided solely as an example, and done in reference to the appended drawings, in which:

FIG. 1 is a diagrammatic view of an electronic system according to the invention, comprising a transducer, an analog-digital converter, and an interface device connected between the transducer and the analog-digital converter, FIG. 2 is an electrical diagram of the interface device of FIG. 1 according to a first embodiment, comprising a polarization stage, adaptation resistances, and an analog switch, FIG. 3 is an electrical diagram of the analog switch of FIG. 2 according to a first embodiment, FIGS. 4 and 5 are diagrams similar to those of FIG. 3, according to alternative embodiments of the analog switch, FIG. 6 is a set of curves illustrating the evolution of the impedance of an analog switch comprising field effect transistors connected in parallel, respectively of an analog switch comprising field effect transistors connected in series, as a function of the voltage applied on the input and output terminals of said switches when the switches are commanded to the closed state, and FIGS. 7, 8 and 9 are diagrams similar to those of FIG. 1, according to other embodiments.

The electronic system 10 includes an electronic component 12 capable of delivering voltage, an analog-digital converter 14, and an interface device 16 according to the invention connected in series between the electronic component 12 and the analog-digital converter 14.

In the embodiment of FIG. 1, the electronic system 10 is an electronic sensor capable of converting a physical data to be measured into a digital signal. The electronic component 12 is a transducer.

Alternatively, the electronic system 10 is a system capable of being connected to a voltage bus, and the electronic component 12 is a bus transmitter.

The transducer 12 is capable of converting the physical data to be measured into an analog voltage Uin.

The analog-digital converter 14 is capable of converting an analog voltage Uout into a digital signal.

As illustrated in FIG. 2, the interface device 16 comprises an input terminal 17 capable of receiving the analog voltage Uin from the transducer 12, an output terminal 18 capable of delivering the output voltage Uout to the analog-digital converter 14 with a voltage gain from the input voltage Uin, and a reference terminal 19 having a reference potential Vref. The input voltage Uin corresponds to the voltage between the input terminal 17 and the reference terminal 19. In other words, Uin=Vin−Vref, where Vin is the potential at the input terminal 17. The output voltage Uout corresponds to the voltage between the output terminal 18 and the reference terminal 19. In other words, Uout=Vout−Vref, where Vout is the potential at the output terminal 18.

The output voltage Uout verifies the following equation:

$$Uout=G \times Uin+U0,$$

where G is the voltage gain comprised between zero and one, inclusive, and U0 is an offset voltage having a predetermined value.

The interface device 16 comprises a first power supply terminal 19A that can be powered by a first power supply voltage Uss with a negative value and a second power supply terminal 19B that can be powered by a second power supply voltage Udd, having a positive value and for example opposite that of the first power supply voltage Uss.

In FIG. 2, the interface device 16 according to a first embodiment comprises a polarization stage 20, a first adaptation resistance 22, a second adaptation resistance 24 and an analog switch 26.

According to this embodiment, the polarization stage 20 can provide a positive polarization, and includes a P-type insulated gate field effect transistor 28, also called PMOS transistor 28 (P-type Metal Oxide Semiconductor Field Effect Transistor), a polarization resistance 30, and a protection diode 32 connected in series.

The polarization stage 20 is connected to the output terminal 18 and can be connected to a positive polarization potential $V_{pol+}$.

The first adaptation resistance 22 is connected by one of its terminals to the input terminal 17 and by its other terminal to the output terminal 18.

The second adaptation resistance 24 is connected by one of its terminals to the analog switch 26 and by its other terminal to the output terminal 18.

The analog switch 26 is connected between the second adaptation resistance 24 and the reference terminal 19.

In the polarization stage 20, the polarization resistance 30 is connected between the transistor 28 and the protection diode 32. The anode of the diode 32 is connected to the polarization resistance 30, and the cathode of the diode 32 is connected to the output terminal 18.

In FIGS. 3 and 4, the analog switch 26 includes an input terminal 34, an output terminal 36, an N-type insulated gate field effect transistor 38, also called NMOS transistor 38 (N-type Metal Oxide Semiconductor Field Effect Transistor), and a PMOS transistor 40 connected in series between the input 34 and output 36 terminals.

The NMOS 38 and PMOS 40 transistors are, for example, placed in insulating boxes capable of electrically insulating them from one another, as well as relative to the other electronic components of the electronic sensor 10. The insulating boxes are, for example, according to those described in document U.S. Pat. No. 5,389,811A column 2 lines 63 to 66 and column 3 lines 3 to 6, in light of FIGS. 3 and 4 of that document.

In the embodiment of FIG. 3, the analog switch 26 includes a protection diode 42 connected by the anode to the substrate 46 of the NMOS transistor 38, and able to be connected by the cathode to the power supply voltage Uss, as well as a protection diode 44 connected by the cathode to the substrate 48 of the PMOS transistor 40, and able to be connected by the anode to the power supply voltage Udd.

In the embodiment of FIG. 4, the substrates 46, 48 of the NMOS 38 and PMOS 40 transistors of the analog switch 26 are alternatively not connected to any electric potential. The substrates 46, 48 of the NMOS 38 and PMOS 40 transistors of the analog switch 26 are then said to be floating.

In FIG. 5, the analog switch 26 alternatively comprises three N- or P-type field effect transistors, alternatingly connected in series. The analog switch 26 comprises the input terminal 34, the output terminal 36, and an NMOS transistor 50, a PMOS transistor 52, and an NMOS transistor 54 connected in series in that order between the input 34 and output 36 terminals.

In the example of FIG. 5, the substrates 56, 58, 60 of the NMOS 50, PMOS 52 and NMOS 54 transistors are not connected to any potential, the substrates being said to be floating.

Alternatively, the analog switch 26 includes a protection diode connected by the anode to the substrate 56 of the NMOS transistor 50, and able to be connected by the cathode to the power supply voltage Uss. The analog switch 26 also includes a protection diode connected by the cathode to the substrate 58 of the PMOS transistor 52, and able to be connected by the anode to the power supply voltage Udd. The analog switch 26 lastly includes a protection diode connected by the anode to the substrate 60 of the NMOS transistor 54, and able to be connected by the cathode to the power supply voltage Uss.

The operation of the interface device 16 according to the invention will now be explained.

In the three embodiments of the analog switch 26 of FIGS. 3 to 5, the switch 26 is controlled using control voltages 62, 64, 66, 67, 68 applied on the gates of the NMOS and PMOS transistors. Each control voltage can assume two different values, the value of the control voltages 62, 66, 68 applied on the NMOS transistors being opposite the value of the voltages 64, 67 applied on the PMOS transistors. In these three embodiments, the possible values for each control voltage are preferably chosen to be equal to the values of the power supply voltages Uss and Udd of the interface device 16.

When the NMOS 38, 50, 54 or PMOS 40, 52 transistors are in their blocked state, the analog switch 26 is in the open state.

Conversely, when the NMOS 38, 50 54 and PMOS 40, 52 transistors are in their on state, the analog switch 26 is in the closed state.

In the closed state, the analog switch 26 has an internal impedance Zon. The first resistance 22 has an impedance Rser, and the second resistance 24 has an impedance Rpar.

Depending on whether the analog switch 26 is open or closed, the impedance Z seen from the input terminal 17 and the voltage gain G of the interface device 16 assume different values summarized in the following table, assuming that the polarization stage 20 is deactivated, in other words that the polarization transistor 28 is blocked, and assuming the impedance of the analog switch 26 in the open state to be very high, typically in the vicinity of several tens of MΩ:

| State of the switch 26 | Input impedance Z of the device 16 | Voltage gain G of the device 16 |
|---|---|---|
| Open | several MΩ | ≈1 |
| Closed | Rser + Rpar + Zon | (Rpar + Zon)/(Rser + Rpar + Zon) |

This time, it is assumed that the polarization stage 20 is activated, in other words that the polarization transistor 28 is on. In the on state, the polarization transistor 28 has an internal impedance Zpmos. The positive polarization potential Vpol+ is, for example, equal to +15 V, and it is assumed that the voltage Uin is lower than the positive polarization potential Vpol+, which makes it possible to ensure that the polarization diode 32 is always on. It is also assumed that the polarization resistance 30 has an impedance Rpol and that the impedance of the analog switch 26 in the open state is very high, typically in the vicinity of several tens of MΩ. This then yields the following table:

| State of the switch 26 | Input impedance Z of the device 16 | Voltage gain G of the device 16 |
|---|---|---|
| Open | Rser + Rpol + Zpmos | $\frac{Rpol + Zpmos}{Rser + Rpol + Zpmos}$ |
| Closed | F1 (Uin) | A | where:
the input impedance Z is a function F1 of the input voltage Uin when the switch 26 is in the closed state, and $$A = \frac{Rpol + Rpar + Zon + Zpmos}{Rser \cdot (Rpol + Rpar + Zon + Zpmos) + (Rpol + Zpmos) \cdot (Rpar + Zon)}$$

The polarization stage 20, shown in FIG. 2, provides a positive offset voltage U0 to the output voltage Uout delivered by the output terminal 18. It also makes it possible, when the device is empty, i.e. when no input voltage Uin is applied on the input terminal 17, to have a non-zero voltage on the input 17 of the device. This is useful for certain types of sensors, in particular discrete avionics sensors.

In the three embodiments described above, adding a protection diode, or leaving the substrates of the NMOS 38, 50, 54 and PMOS 40, 52 transistors floating, prevents conduction of parasitic diodes within those transistors.

This parasitic conduction within a transistor should be avoided, as it causes a significant drop in the impedance between the substrate of the transistor and one of the elements among the drain and the source of the transistor. This parasitic conduction also causes very significant heating due to the rise in the current flowing through the parasitic diodes, often creating breakdowns of the diodes, and therefore the destruction of the transistor.

The analog switch 26 as used in the three embodiments thus prevents the direct polarization of the drain-substrate or source-substrate junctions of the NMOS 38, 50, 54 and PMOS 40, 52 transistors, and therefore the degradation or even destruction of those transistors. When voltages exceeding the control voltages 62, 64, 66, 67, 68 or any power supply voltages of the substrates Uss and Udd are applied on the terminals 34 and 36 of the switch, the switch 26 according to the invention remains in the open state, whereas the switch of the state of the art with the NMOS and PMOS transistors connected in parallel is destroyed when such voltages are applied on its terminals.

Electrically insulating the N- or P-type field effect transistors of the analog switch 26 makes it possible to avoid the degradation or destruction of the transistors after high voltages are applied on the input 17 of the interface device 16, typically voltages in the vicinity of plus or minus 100 V, whereas with the analog switch of the state of the art having a parallel arrangement, a latch-up phenomenon may occur and cause the degradation or even destruction of the transistors.

Connecting the analog switch 26 to the reference potential Vref, as shown in FIG. 2, also makes it possible, for adaptation resistances 22 and 24 of at least several tens of kΩ, or even several hundred kΩ, to guarantee operation in a high inversion regime of the NMOS and PMOS transistors of the switch 26, when the latter is closed. This makes it possible to have an internal impedance of the switch 26 that is substantially constant when said switch 26 is closed, as illustrated in FIG. 6, which shows the evolution of the impedance of two types of analog switches as a function of the voltage applied to those switches.

The first curve 69 illustrates the evolution of the impedance of an analog switch of the state of the art, in the closed state, comprising two N- or P-type field effect transistors connected in parallel, as a function of the voltage applied to that switch.

The second curve 70 illustrates the evolution of the impedance of an analog switch 26 according to the invention, in the closed state, comprising two N- or P-type field effect transistors connected in series, as a function of the voltage applied to that switch.

The two switches are, in this example, powered by voltages Udd equal to +15 V and Uss equal to −15 V and controlled by control voltages 62, 64, equal to Udd and Uss, respectively, or +15 V and −15 V, respectively.

For voltages applied to the terminals of the switches higher than the control voltages 62, 64, the switch of the state of the art with a parallel arrangement has a zero impedance and is destroyed, whereas the switch 26 according to the invention is not destroyed, but has a very strong impedance, for example greater than several tens of MΩ. Due to the placement of the transistors 38, 40 of the switch 26 according to the invention in series, and despite control voltages 62, 64 intended to keep the switch 26 in the closed state, the switch 26 goes into the open state when voltages higher than the control voltages 62, 64 are applied to its terminals.

The voltage resistance range of such a serial switch 26 without being destroyed is thus extended relative to that of the parallel switch of the state of the art. The voltages that such a serial switch 26 can bear in this state are indeed only limited to the breakdown voltages of the electronic components making it up, which depend on the components used.

Furthermore, for voltages applied to the switch 26 between −5 V and +5 V, the switch 26 has an impedance in the vicinity of 1 kΩ, depending on the size of the transistors of said switch. The switch 26 is then in the closed state.

In the closed state, the impedance of a serial analog switch 26 is substantially constant for a narrow voltage range 71. In the example of FIG. 6, the voltage range 71 is between −2 V and +2 V.

Optimal operation in the closed state of the serial analog switch 26 is thus obtained for voltages applied to the switch 26 comprised in the voltage range 71. When this condition is met, the transistors of the switch 26 operate in a high inversion regime, so as to have a substantially constant internal impedance of the switch 26.

One can thus see that connecting such a serial switch 26 to a reference potential Vref makes it possible to extend the voltage operating range of said switch 26 relative to that of the parallel switch of the state of the art.

FIG. 7 illustrates a second embodiment of the invention, for which the elements similar to those of the first embodiment, previously described, are identified using identical references, and are therefore not described again.

The interface device 16 comprises a polarization stage 72 able to provide a negative polarization. The polarization stage 72 includes an NMOS transistor 73, the polarization resistance 30, and the protection diode 32, connected in series.

In the polarization stage 72, the polarization resistance 30 is connected between the NMOS transistor 73 and the protection diode 32. The anode of the diode 32 is connected to the output terminal 18, and the cathode of the diode 32 is connected to the polarization resistance 30.

The polarization stage 72 is on the one hand connected to the output terminal 18, and on the other hand can be connected to a negative polarization potential $V_{pol-}$, so as to provide a negative offset voltage U0 to the output voltage Uout delivered by the output terminal 18.

According to this embodiment of the invention, the input impedance Z, seen from the input terminal 17, and the voltage gain G of the interface device 16, depending on whether the analog switch 26 is open or closed, have values identical to those of the first embodiment.

The advantages of this second embodiment of the interface device 16 are identical, relative to the analog switch 26 and the polarization stage 72, to those of the first embodiment, and are therefore not described again.

FIG. 8 illustrates a third embodiment of the invention for which the elements similar to those of the first embodiment, previously described, are identified using identical references, and are therefore not described again.

According to the third embodiment of the invention, the interface device 16 includes an input terminal 74, an output terminal 76, a reference terminal 77 having a reference potential Vref, the polarization stage 20 able to provide a positive polarization, as well as a first resistance 78, a second resistance 80, a third resistance 82, a fourth resistance 84 and a fifth resistance 86. The interface device 16 also includes a first analog switch 26A and a second analog switch 26B. The first analog switch 26A is connected in parallel with the third resistance 82. The second analog switch 26B is connected in parallel with the fourth resistance 84.

The output terminal 76 corresponds to the connection node between the two analog switches 26A, 26B or, in other words, the connection node between the third and fourth resistances 82, 84.

The first resistance 78, the second resistance 80 and the third resistance 82 are connected in series in that order between the input terminal 74 and the output terminal 76. The first and second resistances 78, 80 are connected to one another at a connection node 88, and the second and third resistances 80, 82 are connected to one another at a connection node 89.

The fourth resistance 84 and the fifth resistance 86 are connected in series, the fourth resistance 84 being connected to the output terminal 76, and the fifth resistance 86 being connected to the reference terminal 77.

The polarization stage 20, comprising a PMOS transistor capable of providing a positive polarization, is on the one hand connected to the connection node 88, and on the other hand can be connected to the positive polarization potential $V_{pol+}$.

Alternatively, the polarization stage comprises an NMOS transistor able to provide a negative polarization as described in FIG. 7. It is on the one hand connected to the connection node 88, and on the other hand can be connected to the negative polarization potential $V_{pol-}$.

For reference voltages of the circuit, and polarization and control voltages of the given switches, the values of the first, second and fifth resistances 78, 80 and 86 are chosen so that for any voltage Uin comprised in the desired operating interval, the voltage applied to the terminals of each switch 26A, 26B in the closed state remains in the voltage range 71.

For a reference potential Vref equal to 0 V, a polarization potential $V_{pol+}$ equal to +5 V, and control voltages equal to +15 V or −15 V, the first, second and fifth resistances 78, 80 and 86 have, for example, the values of 50 kΩ, 30 kΩ and 1 kΩ, respectively.

The first analog switch 26A is denoted S1, and the second analog switch 26B is denoted S2. The switch S1 is connected in parallel with the third resistance 82, and the switch S2 is connected in parallel with the fourth resistance 84.

In the closed state, the two analog switches S1 and S2 have a same internal impedance Zon. The first, second, third, fourth and fifth resistances 78, 80, 82, 84, 86 respectively have impedances R1, R2, R3, R4, R5.

Depending on whether the analog switches S1 and S2 are open or closed, the input impedance Z seen from the input terminal 74 and the voltage gain G of the interface device 16 have different values summarized in the table below, assuming that the polarization stage 20 is deactivated, Zon is small compared to R3 and R4, and the impedance of the analog switches S1 and S2 in the open state is very high, typically in the vicinity of several tens of MΩ:

| State of the switch S1 | State of the switch S2 | Input impedance Z of the device 16 | Voltage gain G of the device 16 |
|---|---|---|---|
| Open | Open | R1 + R2 + R3 + R4 + R5 | (R4 + R5)/ (R1 + R2 + R3 + R4 + R5) |
| Open | Closed | R1 + R2 + R3 + Zon + R5 | (Zon + R5)/ (R1 + R2 + R3 + Zon + R5) |
| Closed | Open | R1 + R2 + Zon + R4 + R5 | (R4 + R5)/ (R1 + R2 + Zon + R4 + R5) |

-continued

| State of the switch S1 | State of the switch S2 | Input impedance Z of the device 16 | Voltage gain G of the device 16 |
|---|---|---|---|
| Closed | Closed | R1 + R2 + 2 × Zon + R5 | (Zon + R5)/ (R1 + R2 + 2 × Zon + R5) |

The polarization stage 20 provides a positive offset voltage U0 to the output voltage Uout delivered by the output terminal 76.

The choice of the first, second and fifth resistances 78, 80 and 86 makes it possible to guarantee the operation in a high inversion regime of the field effect transistors of the analog switches 26A, 26B when said switches are closed. This characteristic of the interface device 16 makes it possible to have a substantially constant internal impedance of the switches 26A, 26B when said switches are closed.

Furthermore, the interface device 16 according to this third embodiment makes it possible, compared with the fourth embodiment described hereafter in reference to FIG. 9, to decrease the surface occupied by the different resistances, and thus to substantially reduce the manufacturing costs.

The other advantages of this third embodiment, relative to the analog switches 26A, 26B and the polarization stage 20, are identical to those of the first embodiment, and are therefore not described again.

FIG. 9 illustrates a fourth embodiment of the invention for which the elements similar to those of the first embodiment, previously described, are identified using identical references, and are therefore not described again.

The interface device 16 according to the fourth embodiment of the invention includes an input terminal 90, an output terminal 92, a reference terminal 93 having a reference potential Vref, three polarization stages 20 each able to provide a specific positive polarization, as well as a first resistance 94, a second resistance 96, a third resistance 98, a fourth resistance 100, a fifth resistance 102 and a sixth resistance 104. The interface device 16 also includes three analog switches 26.

The interface 16 according to this fourth embodiment corresponds to the cascading association of three interface devices of FIG. 2.

Alternatively, one skilled in the art will understand that it is also possible to associate a number N of devices of FIG. 2 in a cascading manner, N being an integer greater than or equal to two.

Each analog switch 26 is on the one hand connected to one resistance among the fourth, fifth and sixth resistances 100, 102, 104, and on the other hand connected to the reference terminal 93.

The first, second and third resistances 94, 96 and 98 are connected in series between the input terminal 90 and the output terminal 92. The first and second resistances 94, 96 are connected to one another at a first connection node 106, and the second and third resistances 96, 98 are connected to one another at a second connection node 108.

Each polarization stage 20 is connected on the one hand to a respective connection node 106, 108 or to the output terminal 92, and can be connected on the other hand to a positive polarization potential $V_{pol+1}$, $V_{pol+2}$, $V_{pol+3}$, respectively.

Alternatively, the three polarization stages can provide a negative polarization as shown in FIG. 7, each polarization stage being connected on the one hand to a respective connection node 106, 108 or to the output node 92, and being able to be connected on the other hand to a negative polarization potential $V_{pol-1}$, $V_{pol-2}$, $V_{pol-3}$, respectively.

Alternatively, one skilled in the art will understand that it is also possible to associate a number N of devices of FIG. 7 in a cascading manner, N being an integer greater than or equal to two.

The three analog switches 26 are differentiated from one another: a first switch 26 is designated switch S3, a second switch 26 is designated switch S4, and the third switch 26 is designated switch S5.

The three analog switches 26 are respectively denoted S3, S4 and S5, the switch S3 being connected to the first connection node 106 by means of the fourth resistance 100, the switch S4 being connected to the second connection node 108 by means of the fifth resistance 102, and the switch S5 being connected to the output terminal 92 by means of the sixth resistance 104.

In the closed state, the analog switches S3, S4 and S5 have a same internal impedance Zon. The first, second, third, fourth, fifth and sixth resistances 94, 96, 98, 100, 102, 104 respectively have impedances R1, R2, R3, R4, R5, R6.

Depending on whether the analog switches S3, S4 and S5 are open or closed, the input impedance Z seen from the input terminal 90 and the voltage gain G of the interface device 16 have different values summarized in the following table, assuming that the three polarization stages 20 are deactivated and the impedance of the analog switches S3, S4 and S5 in the open state is very high, typically in the vicinity of several tens of MΩ:

| State of the switch S3 | State of the switch S4 | State of the switch S5 | Input impedance Z of the device 16 | Voltage gain G of the device 16 |
|---|---|---|---|---|
| Open | Open | Open | several MΩ | ≈1 |
| Open | Open | Closed | R1 + R2 + R3 + Zon + R6 | (Zon + R6)/ (R1 + R2 + R3 + R6 + Zon) |
| Open | Closed | Open | R1 + R2 + R5 + Zon | (Zon + R5)/ (R1 + R2 + R5 + Zon) |
| Open | Closed | Closed | $\dfrac{R1 + R2 + (R5 + Zon) \cdot (R3 + R6 + Zon)}{R3 + R5 + R6 + 2 \times Zon}$ | B |
| Closed | Open | Open | R1 + R4 + Zon | (Zon + R4)/ (R1 + R4 + Zon) |
| Closed | Open | Closed | C | D |
| Closed | Closed | Open | E | F |
| Closed | Closed | Closed | G | H |

-continued

| State of the switch S3 | State of the switch S4 | State of the switch S5 | Input impedance Z of the device 16 | Voltage gain G of the device 16 |
|---|---|---|---|---| where:

$$B = \frac{(R5 + Zon) \cdot (R6 + Zon)}{(R1 + R2) \cdot (R3 + R5 + R6 + 2xZon) + (R5 + Zon) \cdot (R3 + R6 + Zon)}$$

$$C = R1 + \frac{(R4 + Zon) \cdot (R2 + R3 + R6 + Zon)}{R2 + R3 + R4 + R6 + 2xZon}$$

$$D = \frac{(R4 + Zon) \cdot (R6 + Zon)}{R1 \cdot (R2 + R3 + R4 + R6 + 2xZon) + (R4 + Zon) \cdot (R2 + R3 + R6 + Zon)}$$

$$E = R1 + \frac{(R4 + Zon) \cdot (R2 + R5 + Zon)}{R2 + R4 + R5 + 2xZon}$$

$$F = \frac{(R4 + Zon) \cdot (R5 + Zon)}{R1 \cdot (R2 + R4 + R5 + 2xZon) + (R4 + Zon) \cdot (R2 + R5 + Zon)}$$

$$G = a + \frac{b \cdot [c(d + e + f) + d \cdot (e + f)]}{(b + c) \cdot (d + e + f) + d \cdot (e + f)}$$

$$H = \frac{bdf}{acd + ace + acf + ade + adf + abe + abf + abd + bce + bcf + bcd + bde + bdf}$$

with:
a = R1
b = R4 + Zon
c = R2
d = R5 + Zon
e = R3
f = R6 + Zon

The three polarization stages 20 provide a positive offset voltage U0 to the output voltage Uout delivered by the output terminal 92.

More generally, the number of possible values for the input impedance and the voltage gain of the interface device 16 depends on the number of analog switches 26 used.

One can thus see that, compared with the interface device 16 according to the first embodiment, the interface device according to this embodiment makes it possible to obtain a larger number of possible values for the input impedance and the voltage gain of the device.

Furthermore, the interface device 16 according to this fourth embodiment is easier to implement than the interface device according to the third embodiment because it does not impose any particular choices on the values of the resistances.

The other advantages of this fourth embodiment, relative to the analog switches 26 and the polarization stages 20, are identical to those of the first embodiment, and are therefore not described again.

The invention claimed is:

1. An interface device (16), which can be connected between two electronic components (12, 14) of an electronic circuit (10) and comprising:
   an input terminal (17; 74; 90), an output terminal (18; 76; 92) and a reference terminal (19; 77; 93), the device (16) having an input voltage between the reference terminal and the input terminal, an output voltage between the reference terminal and the output terminal, an input impedance, and an output voltage gain,
   at least one resistance (22, 24; 78, 82, 84; 94, 98, 104) connected to at least one terminal among the input terminal and the output terminal,
   at least one analog switch (26; 26B) positioned between the output terminal and the reference terminal, the switch having a closed state or an open state, and
   control means (62, 64; 66, 67, 68) for the or each switch (26; 26B), at least one parameter among the input impedance and the output voltage gain of the device (16) having distinct values as a function of whether the analog switch is closed or open (26; 26B),
   characterized in that the or each analog switch (26; 26B) comprises at least one N-type field effect controllable transistor (38; 50, 54) and one P-type field effect controllable transistor (40; 52) connected in series.

2. The device (16) according to claim 1, characterized in that it comprises two resistances, the first resistance (22; 78, 80, 82; 94, 96, 98) being connected between the input terminal (17; 74; 90) and the output terminal (18; 76; 92), and the second resistance (24; 84; 104) being connected to the analog switch (26; 26B) on the one hand and the output terminal (18; 76; 92) on the other hand.

3. The device (16) according to claim 1, characterized in that the or each analog switch (26; 26B) comprises at least three N- or P-type controllable field effect transistors (50, 52, 54), alternatingly connected in series.

4. The device (16) according to claim 1, characterized in that the field effect transistors (38, 40; 50, 52, 54) of the or each analog switch are MOSFET transistors of the N (NMOS) or P (PMOS) type.

5. The device (16) according to claim 1, characterized in that it comprises a polarization stage (20; 72) connected to the output terminal of the device and capable of being connected to a polarization potential, and in that the polarization stage (20; 72) comprises a polarization resistance (30), a field effect controllable transistor (28; 73), and a protection diode (32) of the transistor.

6. The device (16) according to claim 5, characterized in that the transistor (28; 73) of the or each polarization stage (20; 72) is a MOSFET transistor of the P (PMOS) or N (NMOS) types.

7. The device (16) according to claim 1, characterized in that it comprises a plurality of resistances (78, 80, 82; 94, 96, 98) connected in series between the input terminal and the output terminal, and in that the resistances are connected to one another at respective connection nodes (88, 89; 106, 108).

8. The device (16) according to claim 7, characterized in that it comprises at least one polarization stage (20; 72) connected, on the one hand, to a point among the output terminal (18; 92) and one of said connection nodes (88; 106, 108) and capable of being connected, on the other hand, to a polarization potential, and in that the or each polarization stage (20;

72) comprises a polarization resistance (30), a controllable field effect transistor (28; 73), and a protection diode (32) of the transistor.

9. The device (16) according to claim 1, characterized in that the substrates (46, 48) of each field effect transistor of the or each analog switch (26; 26B) are connected to protection diodes (42, 44).

10. The device (16) according to claim 1, characterized in that the substrates (46, 48; 56, 58, 60) of each field effect transistor of the or each analog switch (26; 26B) are not electrically connected to any potential.

11. The device (16) according to claim 1, characterized in that it includes means for establishing a high inversion regime of the field effect transistors of the or each analog switch (26; 26B), when said switch(es) (26; 26B) are in their closed state.

12. The device (16) according to claim 1, characterized in that the control means (62, 64; 66, 67, 68) for the or each analog switch (26; 26B) are capable of applying control voltages on the gate of each field effect transistor of the or each analog switch, the voltage applied on the gate of each N-type field effect transistor of a given switch (26; 26B) having a value opposite that of the voltage applied on the gate of each P-type field effect transistor of that given switch (26; 26B).

13. An electronic system (10) comprising:
an electronic component (12) able to deliver a voltage,
an analog-digital converter (14), and
an interface device (16) connected between the electronic component (12) and the analog-digital converter (14),
characterized in that the interface device (16) is according to claim 1.

14. The electronic system (10) according to claim 13, characterized in that the maximum value of the voltage delivered by the electronic component (12) is greater than the supply voltages of the interface device (16), or the control voltages of the or each analog switch (26; 26B) of the interface device (16).

* * * * *